United States Patent [19]

Suzuki et al.

[11] 4,132,575
[45] Jan. 2, 1979

[54] METHOD OF PRODUCING THREE-DIMENSIONAL REPLICA

[75] Inventors: Masane Suzuki, Omiya; Kiyoshi Suzuki, Aego, both of Japan

[73] Assignee: Fuji Photo Optical Co., Ltd., Omiya, Japan

[21] Appl. No.: 833,989

[22] Filed: Sep. 16, 1977

[51] Int. Cl.² .................... B44C 3/00; G03C 5/04; G03C 5/00

[52] U.S. Cl. ................... 156/58; 96/27 R; 96/27 E; 96/35; 96/36; 96/40; 83/72; 83/523; 156/59

[58] Field of Search ............ 96/27 R, 36, 27 E, 40, 96/46, 35; 156/59, 58; 83/72, 523

[56] References Cited

U.S. PATENT DOCUMENTS

| | | | |
|---|---|---|---|
| 2,493,439 | 1/1950 | Braund | 96/27 R |
| 2,694,634 | 11/1954 | Debenham | 96/27 R |
| 3,399,993 | 9/1968 | Agnew | 96/27 R |
| 3,539,410 | 11/1970 | Meyer | 156/58 |
| 3,544,402 | 12/1970 | Agnew | 156/58 |
| 3,573,045 | 3/1971 | Lemelson | 156/58 X |
| 3,580,758 | 5/1971 | Morioka | 156/58 |
| 3,690,881 | 9/1972 | Kink | 96/27 R |
| 3,763,296 | 10/1973 | Burrows | 96/46 X |
| 3,915,705 | 10/1975 | Hazenbosch et al. | 96/27 E X |
| 3,988,520 | 10/1976 | Riddle | 156/59 X |

Primary Examiner—Edward C. Kimlin

[57] ABSTRACT

A moire contour map of a three-dimensional object is obtained by a moire contour measuring system. The moire contour map is used for making a profiling model to be used in a profiling machine to make a number of plates having configurations corresponding to the contour lines of the moire contour map. The number of plates prepared by the profiling machine are stacked to form a stack of plates having a contour approximately equivalent to the contour of the original three-dimensional object. The stacked plates are bound together and a surface smoothing cover or a filling agent is applied on the surface of the stacked plates to form a replica of the object.

7 Claims, 13 Drawing Figures

FIG.12
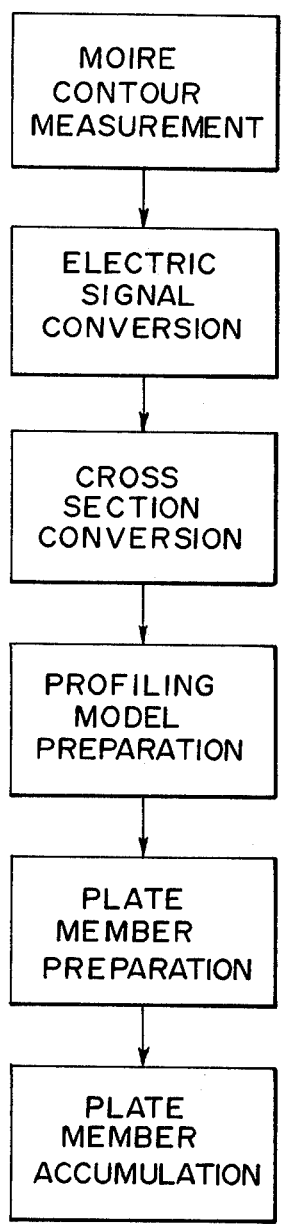
FIG.13A
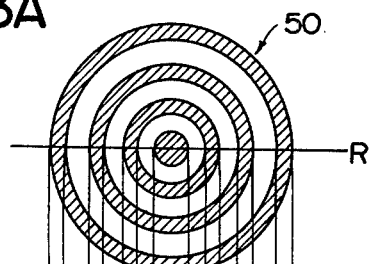
FIG.13B
FIG.13C
FIG.13D
FIG.13E
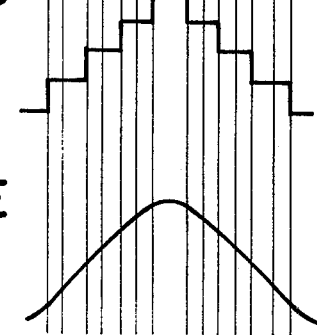

METHOD OF PRODUCING THREE-DIMENSIONAL REPLICA

BACKGROUND OF THE INVENTION

1. Field of the Invention

This invention relates to a method of producing a three-dimensional replica of a three-dimensional object, and more particularly to a method of producing a three-dimensional replica of an object directly from a moire contour map of the object obtained by a moire contour measuring system.

2. Description of the Prior Art

It has been difficult to produce a three-dimensional ("3D") replica of a 3D object from information concerning the 3D object obtained photographically and it has been particularly difficult to produce such a replica when the object is moving. For instance, when a statue or bust of a human figure is produced, the basic dimensions of the figure are measured and the details are manually replicated. Therefore, it is very difficult to precisely replicate the figure. In order to facilitate the production of a 3D replica, it is therefore desired that a 3D replica be produced automatically directly from a contour map or the like obtained by means of a moire contour measuring system. Further, in the moire contour measurement, it is preferable that the contour of the 3D object to be replicated be obtained for more than one face of the object simultaneously to produce the replica as precisely as possible and to enable the production of a replica of the whole body of the original 3D object.

In order to precisely replicate a 3D object it is desired that more than one contour map of the object viewed from different directions be obtained simultaneously. When the 3D object is a moving object or an object which does not stand perfectly still, it is impossible to take several views of the object viewed from different directions simultaneously with a single camera. In order to take such views with a single camera, the camera must be rotated around the object or the object must be rotated with respect to the camera. In case of a moving object, therefore, it is very difficult or impossible to obtain the contour maps of the 3D object viewed from different directions simultaneously by a single camera.

SUMMARY OF THE INVENTION

The primary object of the present invention is to provide a method of producing a replica of a 3D object directly from a contour map or maps thereof obtained by a moire contour measuring system.

Another object of the present invention is to provide a method of producing a replica of a 3D object directly from contour maps thereof viewed from different directions simultaneously.

Still another object of the present invention is to provide a method of automatically producing a replica of a 3D object by use of a moire contour map or maps.

The above objects of the present invention are accomplished by preparing a moire contour map of a 3D object by means of moire contour measurement, preparing plate members having configurations corresponding to the contour lines of said contour map, and stacking the plate members to form a 3D replica of said 3D object. The plate members having configurations corresponding to the contour lines of the object are obtained by use of a profiling machine. A model for profiling is prepared by use of the contour map obtained by the moire contour measurement.

The contour maps of a 3D object viewed from different directions simultaneously are obtained by use of three optical systems two of which are used for projecting onto the object shades of gratings and the other of which is used for photographing the object through a grating to take a picture of the object with moire contour lines.

BRIEF DESCRIPTION OF THE DRAWING

FIG. 12 is a block diagram showing the steps of the method in accordance with a preferred embodiment of the present invention, and FIGS. 13A to 13E are explanatory views for explaining an electric signal treating process for obtaining a cross-section of a 3D object from a moire contour map.

DESCRIPTION OF THE PREFERRED EMBODIMENTS

Figure 1:
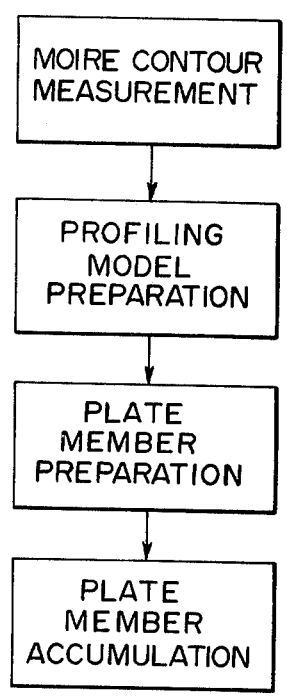
FIG. 1 is a block diagram which shows the basic steps of the method of the present invention.
Figure 2:
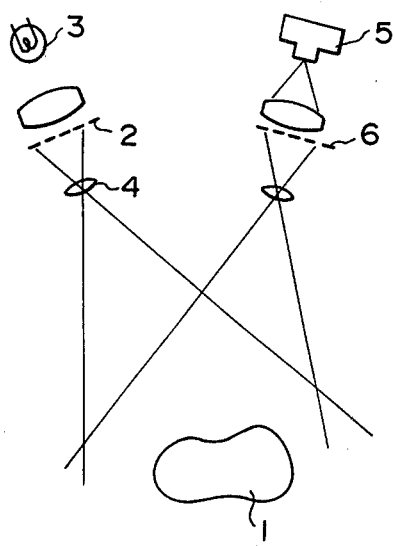
FIG. 2 is a side view schematically showing an example of an optical system for obtaining a moire contour map of a 3D object.

The method of the present invention is basically comprised of four steps as shown in FIG. 1, namely a moire contour measuring step for obtaining a moire contour map of a 3D object by use of a moire contour map producing system as illustrated in FIG. 2, a profiling model preparing step for making a model for a profiling machine directly from the moire contour map, a plate member preparing step for making plate members having contours corresponding to the contour lines of the contour map by a profiling machine using said profiling model, and a plate member stacking step wherein the plate members are assembled to form a 3D replica. After the plate members are simply stacked, the plate members are bound together and a flexible film is applied thereover to form a smooth contour. Instead of the flexible film, a filling agent such as a silicone rubber may be applied on the accumulated plates to form a smooth contour.

Figure 3:
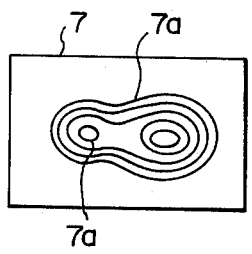
FIG. 3 is a plan view of an example of a moire contour map obtained by the first step of the invention.

The above steps will hereinbelow be described in detail with reference to FIGS. 2 to 8. Referring to FIG. 2, a 3D object 1 is illuminated by light through a grating 2 from a light source 3. The image of the grating 2 is focussed on the 3D object 1 by a focussing lens 4. The 3D object 1 illuminated by the light through the grating 2 is photographed by a camera 5 through another grating 6 to form a moire contour map on the film in the camera. Thus a moire contour map of the object 1 is obtained as shown in FIG. 3. The moire contour map designated by 7 in FIG. 3 is a photographic film carrying an image of contour lines 7a representing the contour of the object 1.

Figure 4:
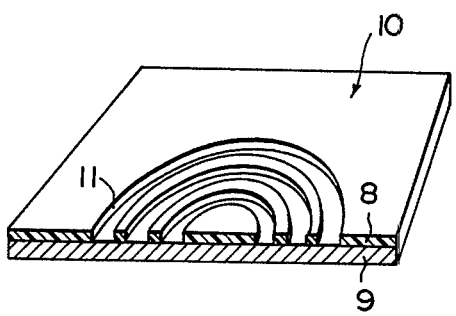
FIG. 4 is a cross-sectional perspective view of an example of a profiling model prepared and used in the present invention.

The film carrying the moire contour map 7 is used for making a profiling model in the next step. A photosensitive resinous layer is applied on a hard substrate and is exposed to light through the film by a contact printing method. After the exposure, the resinous layer is etched to form a profiling model in the form of the contour map. The photosensitive resinous layer is hardened in the regions thereof where it is exposed to light and not hardened in the non-exposed regions. Therefore, the resinous layer is removed from the substrate in a pattern corresponding to the contour lines. FIG. 4 shows an example of a profiling model 10 having a photosensitive resinous layer 8 on a substrate 9. The resinous layer 8 is removed in a pattern corresponding to contour lines 7a of FIG. 3. Thus, the profiling model 10 has grooves 11 for profiling.

Figure 5:
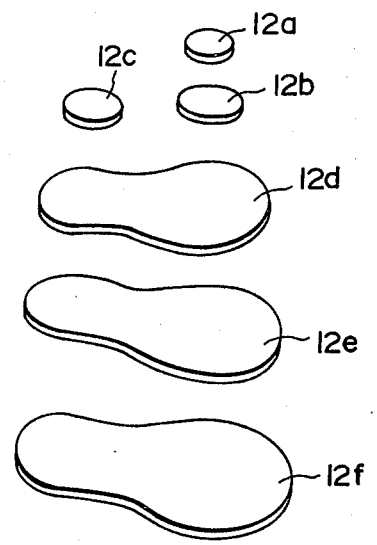
FIG. 5 is a perspective view of plates prepared and used in the present invention.

In the next step, a number of plates 12a–12f as shown in FIG. 5 are made by a profiling machine by use of the profiling model 10. A profiling machines is a well known machine which has a needle or the like which follows the contour of a profiling model and cuts or grinds a member in the shape of the contour. In this invention, the needle or the like follows the grooves 11 of the profiling model 10 and makes a number of plates 12a–12f as shown in FIG. 5.

Figure 6:
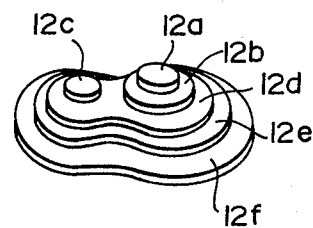
FIG. 6 is a perspective view of a stacked set of plates prepared in the present invention.
Figure 7:
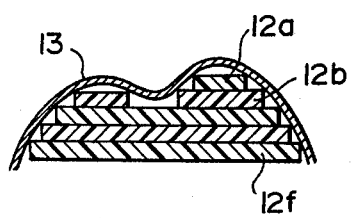
FIG. 7 is a cross-sectioned vertical view of a stacked set of plates covered with a flexible film, prepared in accordance with the present invention.
Figure 8:
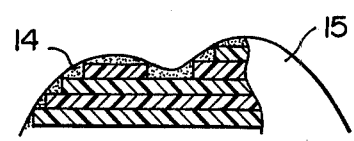
FIG. 8 is a partly sectional side view of a stacked set of plates with a filling agent applied thereon, prepared in accordance with the present invention.

Then, the number of plates 12a–12f are stacked as shown in FIG. 6 and are bound together by use of an adhesive or the like. Then, a flexible film 13 is applied over the stack of plates and fixed to the plates as shown in FIG. 7 to make a replica having a contour corresponding to that of the object 1. Since, in the optical system for obtaining the moire contour map as shown in FIG. 2, the moire contour map 7 is obtained only for one side of the 3D object 1 viewed from one direction, the whole shape of the 3D object cannot be reproduced by use of the system as shown in FIG. 2. FIG. 8 shows another example of a method for making a replica of the 3D object from the stack of plates. In the method as shown in FIG. 8, a filling agent 14 such as silicone rubber is applied on the stack of sheets to form a smooth surface 15 over the tiered surface of the stack.

Figure 9:
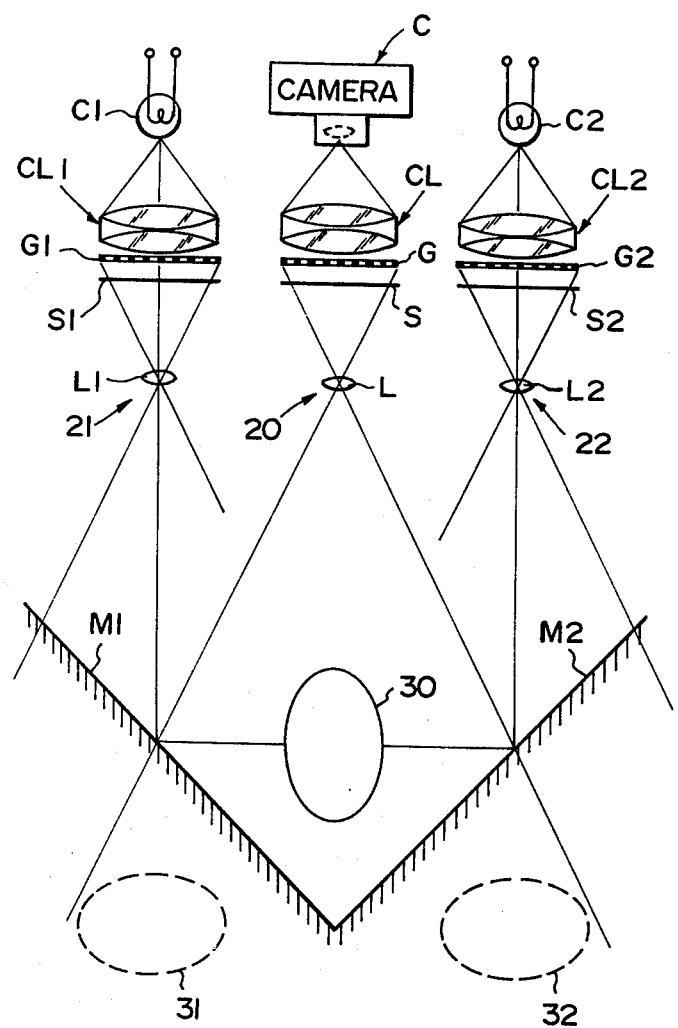
FIG. 9 is a schematic side view of an optical system used for simultaneously obtaining moire contour maps of a 3D object viewed from different directions in accordance with a preferred embodiment of the present invention.
Figure 10:
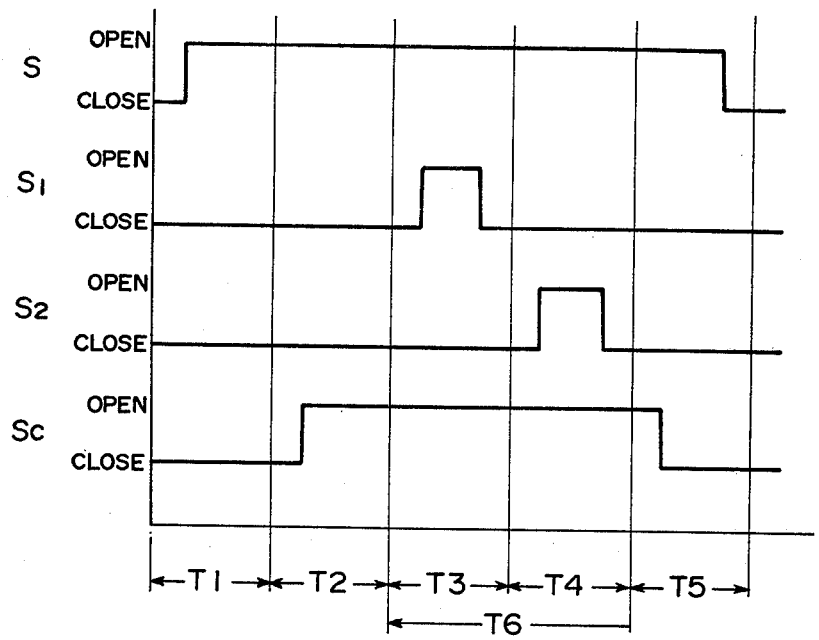
FIG. 10 is a time chart showing the sequential operation of shutter blades used in the optical system shown in FIG. 9.
Figure 11:
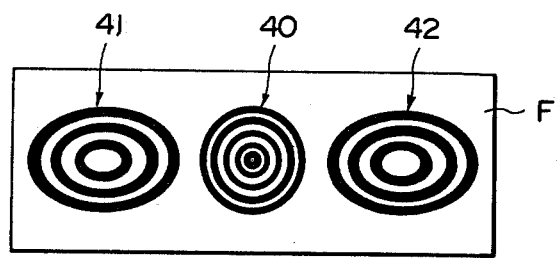
FIG. 11 is a plan view showing contour maps of a 3D object obtained by the optical system as shown in FIG. 9.

In order to make a replica of a 3D object which has a rear face as well as a front face, an optical system as shown in FIG. 9 is used for obtaining a plurality of contour maps viewed from various directions. Referring to FIG. 9, two optical projection systems 21 and 22 and one photographing optical system 20 are provided in parallel to each other. The photographing system 20 is located between the two projection systems 21 and 22. The two projection systems 21 and 22 have light sources C1, C2, condenser lenses CL1, CL2, gratings G1, G2, shutter blades S1, S2 and projection lenses L1, L2 arranged in this order. Further, mirrors M1 and M2 are located in the optical path of the two projection systems 21 and 22 to reflect the light from the light sources C1 and C2 toward a 3D object 30 located on the optical axis of a focussing lens L of the photographing system 20. The photographing system 20 has a camera C, a condenser lens CL, a grating G, a shutter blade S and said focussing lens L in this order in parallel to the equivalent elements of the two projection systems 21 and 22, in which the camera C is located at a position corresponding to that of the light sources C1 and C2. The mirrors M1 and M2 are located on opposite sides of the object 30 to illuminate the object 30 from opposite directions perpendicular to the optical axis of the photographing system 20. When viewed from the camera C, the 3D object 30 and the mirror images 31 and 32 of the object 30 are seen together. The 3D object 30 is illuminated by the two light sources C1 and C2 through the two gratings G1 and G2, respectively, and the picture of the 3D object illuminated by the light through the gratings is photographed by the camera C through another grating G. Therefore, a moire contour map of the front view of the 3D object 30 as designated by 40 in FIG. 11 is obtained together with a pair of moire contour maps of the side views of the 3D object 30 as designated by 41 and 42 in FIG. 1. In photographing the contour maps of the 3D object 30, the three shutter blades S, S1 and S2 are operated as shown in FIG. 10. In FIG. 10, Sc represents the operation of the shutter of the camera C of the photographing optical system 20.

As shown in FIG. 10, at the first stage T1, only the shutter blade S of the photographing system 20 is opened so that the 3D object may be observed through the view finder of the camera C. Then, in the second stage T2, the shutter Sc of the camera C is opened. Then, the shutter blade S1 of the first (left in FIG. 9) projection system 21 is opened to illuminate the left side of the 3D object 30 to form the moire contour map 41 of the left side of the object on the film. Then, the shutter blade S2 of the second (right in FIG. 9) projection system 22 is opened to illuminate the right side of the 3D object 30 to form the moire contour map 42 of the right side of the object on the film. While the left and right side views of the object are photographed, the front view thereof is also photographed by the camera C. Thus, the left side contour map 41, the front contour map 40 and the right side contour map 42 of the 3D object 30 are obtained as shown in FIG. 11. Then, the camera shutter Sc is closed and the shutter blade S of the photographing system S is closed in the fifth stage T5 as shown in FIG. 10.

Since the operation of the two shutter blades S1 and S2 can be conducted instantaneously, the time for photographing the contour maps of the 3D object 30 can be made very short. Therefore, it is possible to obtain several contour maps of a single object viewed from different directions, particularly from the front and from the left and right along a line perpendicular to the front viewing line, almost simultaneously. Thus, it becomes possible to reproduce the whole contour of a 3D object.

By using the three contour maps 40, 41 and 42 as shown in FIG. 11, the whole contour of the 3D object can be reproduced. In practice, by using the left and right contour maps 41 and 42 representing the contour of the 3D object 30 viewed from opposite directions and using the map 40 representing the front contour of the 3D object for reference, two profiling models can be obtained for making two sets of plates similar to the plates 12a–12f shown in FIG. 5. After making two stacks of plates, the two are bound together to form a single solid replica of the 3D object 30. Then, a filling agent is applied on the surface of the plate accumulations to form a smooth surface.

In the above described embodiment, the two projection systems are sequentially energized as shown in FIG. 10. The two projection systems, however, may be energized simultaneously.

In the above described embodiment the profiling model is produced directly from the film on which the moire contour map is recorded by contact printing process. It will be understood by those skilled in the art that the profiling model can be produced without using a photographic film. For instance, the contour map may be focussed on an image pick-up tube of a television camera and the picked up image can be converted to an electric signal representing the moire contour map. Then, the electric signal can be used for making the profiling model. The profiling model may have contour lines corresponding to the contour lines of the moire contour map or to the contour lines of the cross section of the 3D object known from the moire contour lines of the map picked up by the image pick-up tube. FIG. 12 shows the above described methods in a block diagram. An example of the latter method is shown in FIGS. 13A to 13E.

Referring to FIGS. 13A to 13E, a moire contour map 50 is focussed on the face plate of the image pick-up tube of a television camera. The output of the image pick-up tube along a raster R is an analogue output as shown in FIG. 13B. By converting the analogue output to a digital output by use of a threshold level T, a digital output as shown in FIG. 13C can be obtained. Then, by converting the digital output as shown in FIG. 13C to a staircase wave as shown in FIG. 13D and further smoothing the staircase wave to a smooth wave as shown in FIG. 13E, a contour line repesenting the configuration of a cross section of the 3D object can be obtained. In converting the digital output as shown in FIG. 13C to the staircase wave as shown in FIG. 13D, a signal which indicates the minus (−) or plus (+) of the change in level of the staircase that corresponds to the decrease or increase in level of the contour of the 3D object is used together with the digital output. In the region of plus (+), the level is raised when the "1" level of the digital output is changed to "0" level, and in the region of minus (−) the level is lowered when the "0" level is changed to "1" level. The staircase wave as shown in FIG. 13D is changed to the smooth wave 13E through a time constant circuit or a smoothing circuit.

The finally obtained signal as shown in FIG. 13E represents the contour line of the cross section of the 3D object sectioned by a plane perpendicular to the plane of the moire contour map shown in FIG. 13A. By producing a number of profiling models equal to the number of rasters on the image pick-up tube, plate members similar to those prepared in the first embodiment as shown in FIG. 5 can be obtained by use of a profiling machine. The profiling machine can be made from the electric output as shown in FIG. 13E by use of a well known electrically operated machine such as a numerical control profiling machine. Further, it will be understood by those skilled in the art that the plate members can be directly produced from the output signal shown in FIG. 13E by use of a numerical controlled profiling machine.

We claim:

1. A method of producing a three-dimensional replica of a three-dimensional object comprising producing a moire contour map of the three-dimensional object by use of a moire contour measuring system, wherein the said system includes illuminating the said three-dimensional object with light modified by a grating, and photographing the said object so illuminated with a camera utilizing another grating to record the moire contour map, preparing a profiling model which carries profiling curves representing the moire contour lines of said moire contour map from said moire contour map by contact printing the moire contour map on a photosensitive resinous material and removing parts of the resinous material in the form of the moire contour map printed thereon by an etching process, preparing a number of plates having configurations corresponding to said moire contour lines by a profiling machine by use of said profiling model, stacking said number of plates and binding said stacked plates together.

2. A method of producing a three-dimensional replica as defined in claim 1 further comprising applying a surface smoothing means over the surface of the stacked plates.

3. A method of producing a three-dimensional replica as defined in claim 2 wherein said surface smoothing means is a flexible film.

4. A method of producing a three-dimensional replica as defined in claim 2 wherein said surface smoothing means is a filling agent.

5. A method of producing a three-dimensional replica as defined in claim 1 wherein said moire contour map is prepared for a plurality of faces of the three-dimensional object viewed from different directions.

6. A method of producing a three-dimensional replica as defined in claim 5 wherein said plurality of faces of the three-dimensional object viewed from different directions are moire contour-measured simultaneously.

7. A method of producing a three-dimensional replica as defined in claim 6 wherein the three-dimensional object is illuminated simultaneously from different directions by a plurality of light sources and a plurality of mirrors are used to reflect the light from the light sources toward the object and further reflect the light reflected by the object to a camera for photographing moire contour maps.

* * * * *